Aug. 13, 1963 D. F. SCHULZ 3,100,876

TRANSISTOR AMPLIFIER HAVING LOW OUTPUT NOISE

Filed April 28, 1960

INVENTOR
D. F. SCHULZ

BY [signature]
ATTORNEY

3,100,876
TRANSISTOR AMPLIFIER HAVING LOW OUTPUT NOISE

Donald F. Schulz, Santa Clara, Calif., assignor to Hewlett-Packard Company, Palo Alto, Calif., a corporation of California Filed Apr. 28, 1960, Ser. No. 25,284
1 Claim. (Cl. 330—17)

This invention relates to transistor amplifiers and more particularly to temperature compensation for such amplifiers when operated under conditions of low collector current and low collector voltage.

It is frequently desirable to operate a transistor amplifier stage at low collector current and low collector voltage to provide amplification with relatively low values of generated noise as, for example, when used as the input stage of a voltmeter. The noise generated by the amplifier adds an unknown increment to the signal to be measured and therefore reduces the accuracy of the voltmeter.

In addition to the desirable low amount of generated noise, an accurate voltmeter should provide readings which which do not vary with changes in ambinet temperature. Also, an accurate voltmeter should have a high input impedance in order to reduce the amount of current drawn by the voltmeter. In other words, if the voltmeter draws too high a current, its very presence in the circuit is bound to affect the circuit under test.

Accordingly, it is an object of this invention to improve the temperature stability of transistor amplifiers operating under conditions of low collector current and low collector voltage.

It is another object of this invention to provide a transistor amplifier operating under conditions of low collector current and low collector voltage, which is stable under conditions of varying temperatures, and which has a high input impedance.

It is a further object of this invention to provide a transistor amplifier particularly suitable as the input stage of a precise voltmeter.

Figure 1:
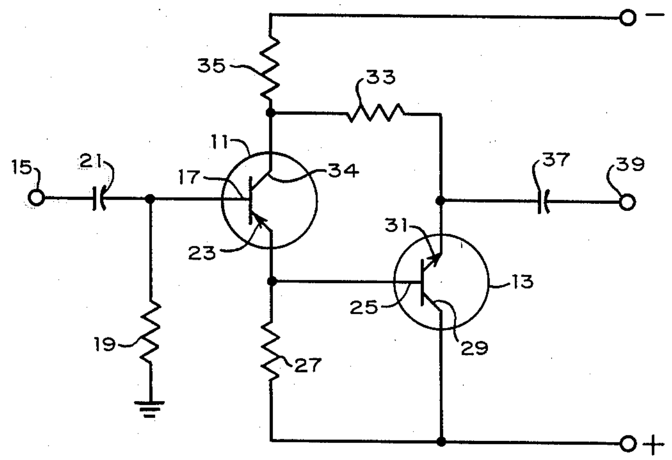
Figure 2:
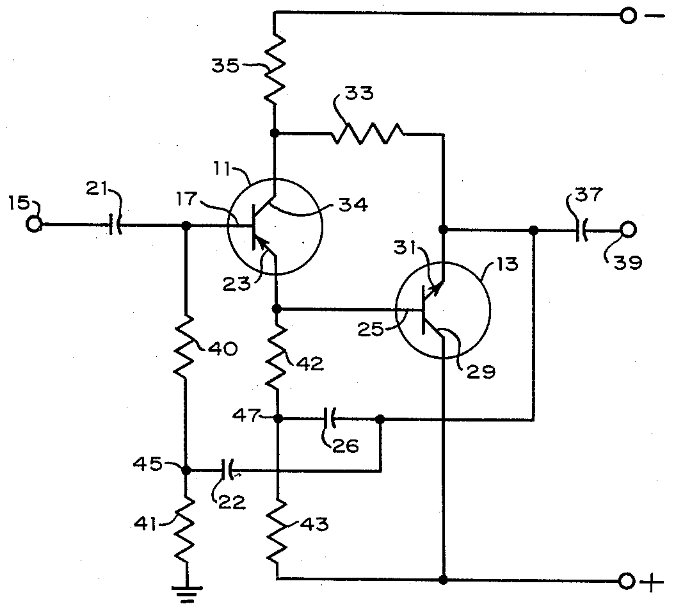

Other and incidental objects of this invention will be apparent from a reading of this specification and an inspection of the accompanying drawing in which:

FIGURE 1 is a schematic diagram of a temperature compensated transistor amplifier, in accordance with this invention, and FIGURE 2 is a schematic diagram of a temperature compensated transistor amplifier in accordance with this invention and which has a high input impedance.

Referring to FIGURE 1, an amplifier comprises a first transistor 11 of one conductivity type, such as PNP, and a second transistor 13 of the opposite conductivity type, such as NPN. An input signal from input terminal 15 is applied to the base 17 and to the resistor 19, connected to the base 17, through coupling capacitor 21. The emitter 23 of transistor 11 is connected to the base 25 of transistor 13 and to a positive supply voltage through resistor 27. The collector 29 of transistor 13 is connected to a positive supply voltage. The collector 34 of transistor 11 is connected to emitter 31 of transistor 13 through resistor 33 and to a negative supply voltage through resistor 35. Output signal from emitter 31 is applied to output terminal 39 and to external circuitry (not shown) through coupling capacitor 37.

Temperature stabilization is achieved in the following manner. The current that flows in the collector 29 of transistor 13 is set so that it is much larger than the current that flows in the collector 34 of transistor 11, which currents flow to a negative supply voltage through resistor 35, which is chosen much larger than resistor 33. As is commonly known in the art, a small, substantially constant voltage drop appears across the base-emitter junction of a transistor, such as across the junction of base 25 and emitter 31 of transistor 13, which drop is independent of emitter current.

For a change in leakage saturation current ($I_{co}$) flowing from base 17 to collector 34 of transistor 11 and through resistor 19 due to a variation in ambient temperature, there will result a change in the voltage across resistor 19 which is the base 17 voltage of transistor 11 referred to a point of ground potential. Equal increments of voltage will result on the base 17 and emitter 23 voltages of transistor 11 and on the base 25 and emitter 31 voltages of transistor 13. Since the increment in the emitter 31 voltage is negligible compared with the magnitude of the negative supply voltage, the current through resistors 33 and 35 is substantially constant and the voltage drop across resistor 33 tends to remain unchanged. Therefore, the voltage from collector 34 to emitter 23 of transistor 11 which is equal to the sum of the voltage across resistor 33 and the base-emitter junction voltage of transistor 13, is stabilized for variations in ambient temperature. Typical design values for transistor 11 range around .5 volt collector to emitter and 100 microamperes collector current. Experimental evidence compiled on transistor amplifiers verifies that relatively lower noise amplification is possible when the transistor is operated under conditions of low collector voltages and low collector current than when the same transistor is operated at normally higher values of collector current and voltage.

In FIGURE 2, the temperature stabilized amplifier of FIGURE 1 is provided with additional means to provide a high input impedance. The circuit connections for the two transistors of the signal amplifying circuit illustrated in FIGURE 2 are seen to be substantially identical to the one for the amplifier circuit of FIGURE 1. In addition, two serially connected resistors 40 and 41 replace the base resistance 19 of transistor 11 and two serially connected resistors 42 and 43 replace the emitter resistance 27 of transistor 11. The common terminal 45 of resistors 40 and 41 is connected to emitter 31 for alternating current signal components by coupling capacitor 22 and common terminal 47 of resistors 42 and 43 is connected to emitter 31 for alternating current signal components by coupling capacitor 26.

In operation, a signal appearing at input terminal 15 is coupled to the base 17 and is transmitted with the gain of an emitter follower to base 25 which is connected to the emitter 23 of transistor 11. From base 25 the signal is again transmitted with the gain of an emitter follower to emitter 31 from whence the signal is returned at a greater power level and at substantially the same amplitude and waveform as the input signal to terminal 45 by capacitor 22 and to terminal 47 by capacitor 26.

High effective emitter load impedance of transistor 11 is obtained as a result of varying both end terminal voltages of resistor 42 simultaneously by substantially the same amount, and in like manner the equivalent impedance of base resistor 40 is made very high.

In accordance with one feature of this invention, high input impedance is achieved as substantially the parallel combination of the equivalent impedance of resistor 40 and the effective emitter load impedance of 11 multiplied by the forward current gain parameter of transistor 11.

Signal amplifying circuits connected as described herein are capable of stable low noise amplification despite relatively large changes in ambient temperature and show high input impedance. Accordingly, the invention may find extensive application as the input stage of a precise voltmeter.

I claim:

An amplifier circuit comprising:

a first transistor of one conductivity type connected in the emitter follower configuration with a pair of resistors serially connected to the emitter;

a second transistor of opposite conductivity type having its collector connected to the common terminal of said serially connected resistors and being connected in the emitter follower configuration;

one of said pair of resistors being connected between the collector of the second transistor and the emitter of the first transistor in which the value thereof is smaller than the value of the other of said pair of resistors;

means for supplying collector current to said transistors, the collector current in the first transistor being higher than the collector current in the second transistor;

means connected to the base of said second transistor for conducting base current therein and for applying input signal thereto;

means connecting the emitter of the second transistor and the base of the first transistor; and means connected to the emitter of the first transistor for providing an output signal from the signal appearing thereon.

References Cited in the file of this patent

UNITED STATES PATENTS

| | | |
|---|---|---|
| 2,858,379 | Stanley | Oct. 28, 1958 |
| 2,942,200 | Hanel | June 21, 1960 |
| 2,963,656 | Parris | Dec. 6, 1960 |

OTHER REFERENCES

Sulzer: "Junction Transistor Circuit Applications," Electronics, August 1953, pages 170–172.

Boxall: "Base Current Feedback and the Feedback Compound Transistor," Semiconductor Products, September/October 1958, pages 17–24.